(12) United States Patent
Makinen

(10) Patent No.: US 6,760,890 B2
(45) Date of Patent: Jul. 6, 2004

(54) SYSTEMS AND METHODS FOR LINKING A GRAPHICAL DISPLAY AND AN N-DIMENSIONAL DATA STRUCTURE IN A GRAPHICAL USER INTERFACE

(75) Inventor: Bruce Allan Makinen, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 278 days.

(21) Appl. No.: 09/997,832

(22) Filed: Nov. 29, 2001

(65) Prior Publication Data

US 2003/0101425 A1 May 29, 2003

(51) Int. Cl.[7] .............................................. G06F 17/50
(52) U.S. Cl. .................................... 716/4; 382/145
(58) Field of Search ........................ 716/1, 4; 345/619, 345/700, 762, 763; 382/141, 145, 147, 150; 348/126

(56) References Cited

U.S. PATENT DOCUMENTS

| | | | |
|---|---|---|---|
| 5,638,523 A | | 6/1997 | Mullet et al. |
| 5,781,447 A | * | 7/1998 | Gerdes ........................ 345/419 |
| 5,969,717 A | * | 10/1999 | Ikemoto ...................... 345/762 |
| 6,195,618 B1 | * | 2/2001 | Rosenberg et al. ......... 700/109 |
| 6,396,475 B1 | | 5/2002 | Ellenby et al. |
| 6,597,381 B1 | | 7/2003 | Eskridge et al. |

FOREIGN PATENT DOCUMENTS

WO    WO 02/091279    11/2002

OTHER PUBLICATIONS

Microsoft, Micorsoft Press Comuter Dictionary, 3rd Ed., 1997, p.133.*
US 20020105550 (IBM)—see abstract and figure 3.
US 20020059215 (CANON)—see abstract and figure 3.

* cited by examiner

*Primary Examiner*—Stacy Whitmore

(57) ABSTRACT

Systems and methods for linking a graphical display and an n-dimensional data structure in a graphical user interface are provided. One is a method for linking a graphical display and an n-dimensional data structure in a graphical user interface supported by a computer application. Briefly described, one such method comprises the steps of: providing a graphical user interface, the graphical user interface comprising a first portion for providing a graphical display comprising one or more image objects and a second portion for providing an n-dimensional data structure associated with the graphical display; receiving a user selection of one of the image objects in the first portion of the graphical user interface; and populating the n-dimensional data structure based on the selection of the image object.

26 Claims, 8 Drawing Sheets

SYSTEMS AND METHODS FOR LINKING A GRAPHICAL DISPLAY AND AN N-DIMENSIONAL DATA STRUCTURE IN A GRAPHICAL USER INTERFACE

TECHNICAL FIELD

The present invention is generally related to graphical displays in a graphical user interface and, more particularly, is related to systems and methods for linking a graphical display and an n-dimensional data structure in a graphical user interface.

BACKGROUND OF THE INVENTION

Currently, a variety of systems and/or processes are used for inspecting manufacturing defects in printed circuit boards. Printed circuit boards typically include one or more electrical components (e.g., computer chips, capacitors, etc.) soldered to an integrated circuit (IC). For many years, the de facto process for production of printed circuit board assemblies included manual visual inspection (MVI) after soldering, followed by an electrical test, such as in-circuit testing (ICT), at the end of the assembly process to isolate any defects that occurred during manufacturing. Typically, a final functional test was run to verify that the printed circuit board operated properly before it was integrated into a final product.

As the need for more complex printed circuit boards having more components increased, automated inspection systems became popular. Such inspection systems typically comprise a printed circuit board modeling system, an imaging system, and a control system. Typically, the modeling system is used to generate a computer model of a printed circuit board that is to be mass-produced. The imaging system comprises hardware and/or software for capturing an image of the manufactured printed circuit board. Currently, image systems employ a variety of imaging techniques (e.g. x-ray, optical, ultrasonic, thermal image, etc.). The control system typically receives a file containing a computer model of the particular printed circuit board from the modeling system. Based on the computer model, the control system may generate an inspection program to be implemented by the imaging system. The inspection program may be used to image a manufactured printed circuit board, which is based on the computer model generated by the modeling system. After the imaging system generates the images of the manufactured printed circuit board, the images may be compared to the computer model to inspect for a variety of manufacturing defects (e.g., open solder joints, shorts, missing components, misaligned components, insufficient solder joints, excess solder joints, reversed capacitors, solder balls, solder voids, etc).

Control systems implemented in current PCB inspection systems typically employ a graphical user interface to assist in generating the inspection program to be implemented by the imaging system and for interfacing with the PCB modeling system. The graphical user interface typically includes a portion for providing a graphical display comprising one or more image objects which may comprise, for example, the model of the printed circuit board. The graphical user interface, and a computer program associated with the control system that supports the graphical user interface, may also be configured to enable a user to select various image objects in the graphical display. For instance, in the graphical display of a model of a printed circuit board, the one or more image objects may comprise a particular component on the PCB, a pin on a particular component, etc.

For a number of reasons, it may be advantageous to organize information associated with the selected image objects in the graphical display in a manageable and user-friendly manner within the graphical user interface. Nonetheless, existing systems do not provide a means to do this. Thus, there is a need in the industry for systems and methods for linking a graphical display and an n-dimensional data structure in a graphical user interface.

SUMMARY OF THE INVENTION

The present invention provides systems and methods for linking a graphical display and an n-dimensional data structure in a graphical user interface.

One embodiment of the present invention is a method for linking a graphical display and an n-dimensional data structure in a graphical user interface supported by a computer application. Briefly described, one such method comprises the steps of: providing a graphical user interface, the graphical user interface comprising a first portion for providing a graphical display comprising one or more image objects and a second portion for providing an n-dimensional data structure associated with the graphical display; receiving a user selection of one of the image objects in the first portion of the graphical user interface; and populating the n-dimensional data structure based on the selection of the image object.

Another embodiment of the present invention is a computer program embodied in a computer-readable medium for linking a graphical display and an n-dimensional data structure in a graphical user interface supported by a computer application. Briefly described, one such computer program comprises logic configured to: provide a graphical user interface, the graphical user interface comprising a first portion for providing a graphical display comprising one or more image objects and a second portion for providing an n-dimensional data structure associated with the graphical display; receive a user selection of one of the image objects in the first portion of the graphical user interface; and populate the n-dimensional data structure based on the selection of the image object.

Another embodiment of the present invention is a system for linking a graphical display and an n-dimensional data structure in a graphical user interface supported by a computer application. Briefly described, one such system comprises logic, a processing device configured to implement the logic, and a display device configured to support the graphical user interface. The logic is configured to: provide a graphical user interface, the graphical user interface comprising a first portion for providing a graphical display comprising one or more image objects and a second portion for providing an n-dimensional data structure associated with the graphical display; receive a user selection of one of the image objects in the first portion of the graphical user interface; and populate the n-dimensional data structure based on the selection of the image object.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
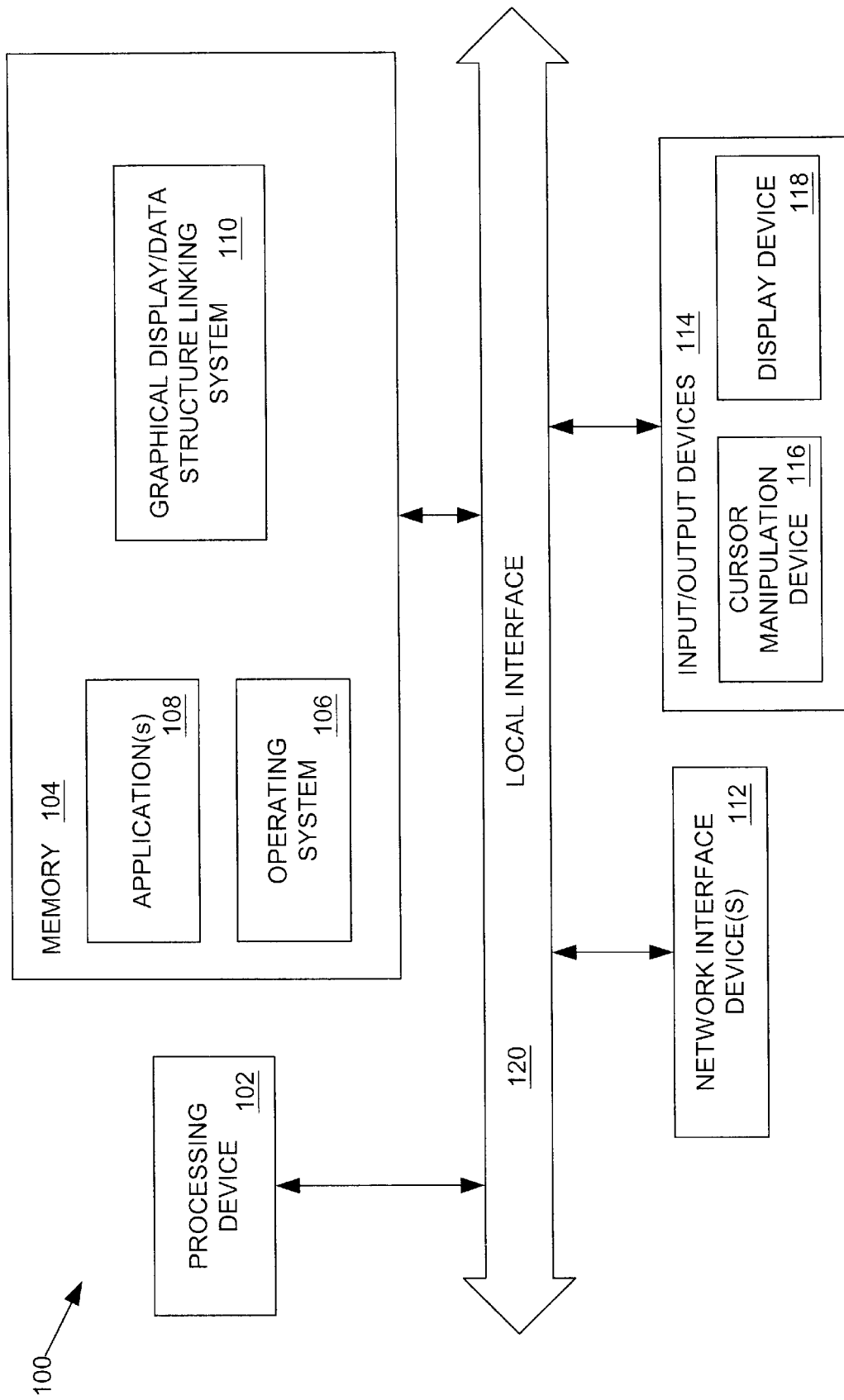
FIG. 1 is a block diagram of an embodiment of a system in which a graphical display/data structure linking system of the present invention may be implemented.
Figure 2:
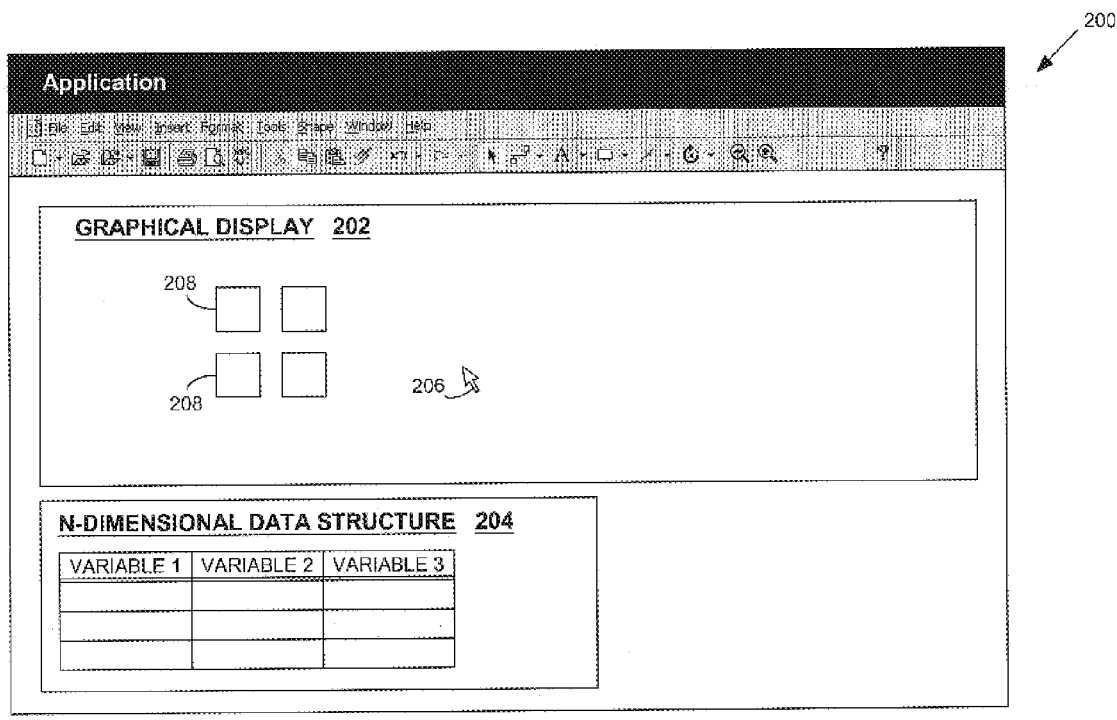
FIG. 2 is a screen shot of an embodiment of a graphical user interface generated by the graphical display/data structure linking system of FIG. 1.

FIG. 1 is a block diagram of a system 100 in which an embodiment of a graphical display/data structure linking system 110 of the present invention may be implemented. In general, graphical display/data structure linking system 110 supports a graphical user interface configured for interaction with a user. As illustrated in FIG. 2, graphical display/data structure linking system 110 provides a graphical user interface comprising a first portion 202 for providing a graphical display of one or more image objects 208, which may comprise, for example, a model of a printed circuit board. For instance, in the graphical display of a model of a printed circuit board, the one or more image objects 208 may comprise a particular component on the printed circuit board, a pin on a particular component, a solder joint, etc. Graphical display/data structure linking system 110 also provides a second portion 204 for providing a data structure associated with the graphical display. One of ordinary skill in the art will appreciate that the data structure may comprise any number of dimensions, and therefore may be referred to generally as an n-dimensional data structure. As illustrated in FIG. 2, the data structure may comprise data fields for one or more variables. Thus, in one embodiment, the data structure comprises a data table comprising one or more rows of data fields for one or more variables. In alternative embodiments, the data structure may comprise a list, an array, a record, a file, or any other scheme for organizing related pieces of information related to the image objects in the graphical display. The graphical user interface may further comprise a cursor 206, by which a user may interact with graphical display/data structure linking system 110, such as by moving the cursor 206 and selecting the image objects 208 in the graphical display 202.

The graphical user interface may comprise additional portions for providing a number of other application services. As illustrated in FIG. 2, the graphical user interface may also comprise a tool bar that contains a number of short-cuts for implementing common commands, as well as drop-down menus for implementing functions located under categories, such as "File," "Edit," View," "Insert," "Format," "Tools," etc.

As described in more detail below, graphical display/data structure linking system 110 provides a link between the image objects 208 in the graphical display and the n-dimensional data structure. In general, graphical display/data structure linking system 110 enables a user to select image objects 208 in the graphical display. Based on the selection of image objects 208 in the graphical display, graphical display/data structure linking system 110 automatically populates the n-dimensional data structure with corresponding data associated with the selected image object 208.

Graphical display/data structure linking system 110 may be implemented in software, firmware, hardware, or a combination thereof. In the embodiment illustrated in FIG. 1, graphical display/data structure linking system 110 is implemented in software, as an executable program, which is executed by a processing device 102. Generally, in terms of hardware architecture, as shown in FIG. 1, system 100 comprises a processing device 102, memory 104, one or more network interface devices 112, and one or more input and/or output (I/O) devices 114 interconnected via a local interface 120. System 100 may further comprise additional components not illustrated in FIG. 2.

Referring again to FIG. 1, the various components of system 100 will be described. Local interface 120 may be, for example but not limited to, one or more buses or other wired or wireless connections. The local interface 120 may have additional elements, which are omitted for simplicity, such as controllers, buffers (caches), drivers, repeaters, and receivers, to enable communications. Furthermore, the local interface 120 may include address, control, and/or data connections to enable appropriate communications among the aforementioned components.

Processing device 102 is a hardware device for executing software, particularly that stored in memory 104. Processing device 102 may be any custom-made or commercially-available processor, a central processing unit (CPU), an auxiliary processor among several processors associated with system 100, a semiconductor based microprocessor (in the form of a microchip or chip set), a macroprocessor, or generally any device for executing software instructions.

As illustrated in FIG. 1, memory 104 may comprise an operating system 106, one or more applications 108, and graphical display/data structure linking system 110. The architecture, operation, and/or functionality of graphical display/data structure linking system 110 will be described in detail below. Memory 104 may include any one or combination of volatile memory elements (e.g., random access memory (RAM, such as DRAM, SRAM, SDRAM, etc.)) and nonvolatile memory elements (e.g., ROM, hard drive, tape, CDROM, etc.). Memory 104 may incorporate electronic, magnetic, optical, and/or other types of storage media. Furthermore, memory 104 may have a distributed architecture, in which various components are situated remote from one another, but can be accessed by processing device 102.

The software in memory 104 may include one or more separate programs, each of which comprises executable instructions for implementing logical functions. In the example of FIG. 1, the software in memory 104 includes graphical display/data structure linking system 110 according to the present invention. Memory 104 may further comprise a suitable operating system 106 that controls the execution of other computer programs, such as one or more applications 108 and graphical display/data structure linking system 110, and provides scheduling, input-output control, file and data management, memory management, and communication control and related services.

Graphical display/data structure linking system 110 may be a source program, executable program (object code), script, or any other entity comprising a set of instructions to be performed. When implemented as a source program, then the program needs to be translated via a compiler, assembler, interpreter, or the like, which may or may not be included within the memory 104, so as to operate properly in connection with operating system 106. Furthermore, graphical display/data structure linking system 110 may be written as (a) an object oriented programming language, which has classes of data and methods, or (b) a procedure programming language, which has routines, subroutines, and/or functions, for example but not limited to, C, C++, Pascal, Basic, Fortran, Cobol, Perl, Java, and Ada.

Network interface device(s) 112 may be any device configured to facilitate communication between system 100 and a communication network, such as a public or private packet-switched or other data network including the Internet, a circuit switched network, such as the public switched telephone network, a wireless network, an optical network, or any other desired communications infrastructure.

Input/output devices 114 may comprise any device configured to communicate with local interface 120. One of ordinary skill in the art will appreciate that, depending on the configuration of system 100, input/output devices 120 may include any of the following, or other, devices: a keyboard, a mouse, display device, such a computer monitor, a serial port, a parallel port, a printer, speakers, a microphone, etc.

As illustrated in FIG. 1, system 100 may include a cursor manipulation device 116 and a display device 118. As stated above, graphical display/data structure linking system 110 may be configured to enable a user to select image objects 208 in a graphical display portion of a graphical user interface via display device 118 and cursor manipulation device 116. Thus, one of ordinary skill in the art will appreciate that display device 118 may comprise any of the following (or other) types of devices configured to support the graphical user interface: a computer monitor, a liquid crystal display (LCD), a plasma-based display, an LED-based display, a touch-sensitive screen, such as those implemented in portable computing devices (e.g., a personal digital assistant (PDA)), and any other known or future display device, regardless of the underlying display technology. Furthermore, cursor manipulation device 116 may comprise any input device configured to cooperate with an application 108, operating system 106, and/or graphical display/data structure linking system 110 and manipulate a cursor displayed on the display device 118. For example, cursor manipulation device 116 may comprise a mouse, a trackball, a set of navigation keys (e.g., arrow keys), and a joystick stick, to name a few.

During operation of system 100, the processing device 102 is configured to execute logic stored within the memory 104, to communicate data to and from the memory 104, and to generally control operations of the system 100 pursuant to the software. Graphical display/data structure linking system 110 and operating system 106, in whole or in part, but typically the latter, are read by the processing device 102, perhaps buffered within the processing device 102, and then executed.

In embodiments where graphical display/data structure linking system 110 is implemented in software, as is shown in FIG. 1, graphical display/data structure linking system 110 may be stored on any computer-readable medium for use by or in connection with any computer related system or method. In the context of this document, a computer-readable medium may be an electronic, magnetic, optical, or other physical device or means that may contain or store a computer program for use by or in connection with a computer-related system or method. Graphical display/data structure linking system 110 may be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In alternative embodiments where graphical display/data structure linking system 110 is implemented in hardware, graphical display/data structure linking system 110 may be implemented with any or a combination of the following, or other, technologies: a discrete logic circuit(s) having logic gates for implementing logic functions upon data signals, an application specific integrated circuit (ASIC) having appropriate combinational logic gates, a programmable gate array (s) (PGA), a field programmable gate array (FPGA), etc.

Figure 3:
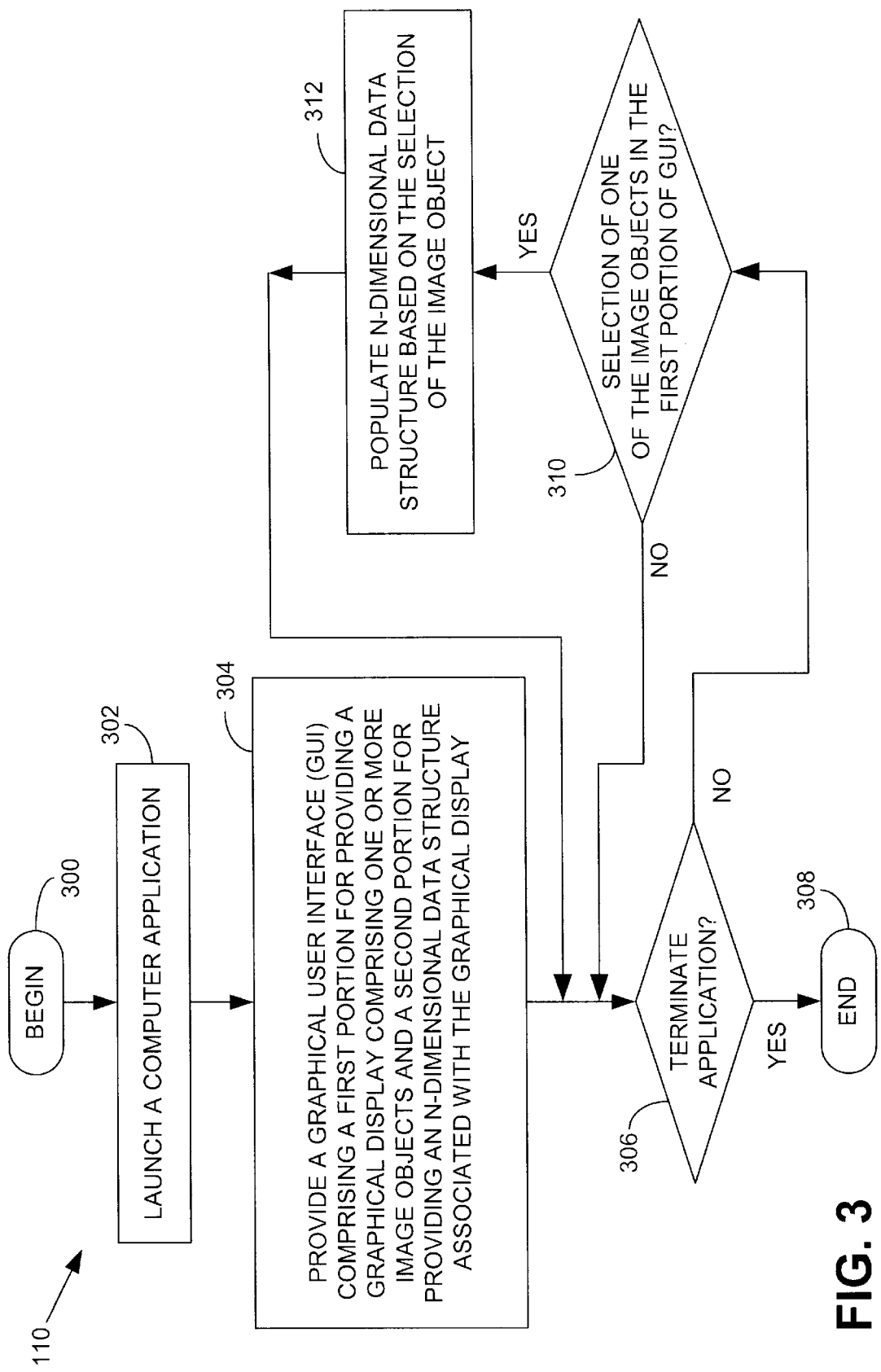
FIG. 3 is a flow chart illustrating the architecture, operation, and/or functionality of the graphical display/data structure linking system of FIGS. 1 and 2.

FIG. 3 is a flow chart illustrating the architecture, functionality, and/or operation of an embodiment of graphical display/data structure linking system 110. Graphical display/data structure linking system 110 begins at block 300. Graphical display/data structure linking system 110 may be initiated by a user via an I/O device 114. In certain embodiments, graphical display/data structure linking system 110 may be implemented as a function that may be called by operating system 106 and an application 108. In alternative embodiments, the functionality of graphical display/data structure linking system 110 may be seamlessly implemented within an application 108. In such embodiments, graphical display/data structure linking system may launch the computer application at block 302.

Regardless of the manner in which it is initiated, at block 304, graphical display/data structure linking system 110 provides a graphical user interface comprising a first portion for providing a graphical display and a second portion for providing an n-dimensional data structure associated with the graphical display. As stated above, the graphical display comprises one or more image objects 208, which may be selected by a user. Generally, an image object may be any item in the graphical display portion of the graphical user interface that may be individually, or otherwise, selected and manipulated by a user. Image objects may comprise text, shapes, pictures, etc. By way of example, graphical display/data structure linking system 110 may display a model of a printed circuit board, in which case the one or more image objects may comprise a particular component on the printed circuit board, a pin on a particular component, a solder joint, etc. Furthermore, the data structure may comprise any number of dimensions.

As stated above, graphical display/data structure linking system 110 may be implemented seamlessly within a computer application. Accordingly, in such embodiments, at decision block 306, graphical display/data structure linking system 110 determines whether the computer application is terminated. If the computer application is terminated, graphical display/data structure linking system 110 terminates at block 308. If the computer application is not terminated (or in alternative embodiments where graphical display/data structure linking system 110 is not implemented within the computer application), at decision block 310, graphical display/data structure linking system 110 determines whether an image object has been selected by a user. If an image object is selected by a user, at block 312, graphical display/data structure linking system 110 automatically populates the n-dimensional data structure with data corresponding to the selected image object. If an image object is not selected, decision blocks 306 and/or 310 may be repeated.

Figure 4:
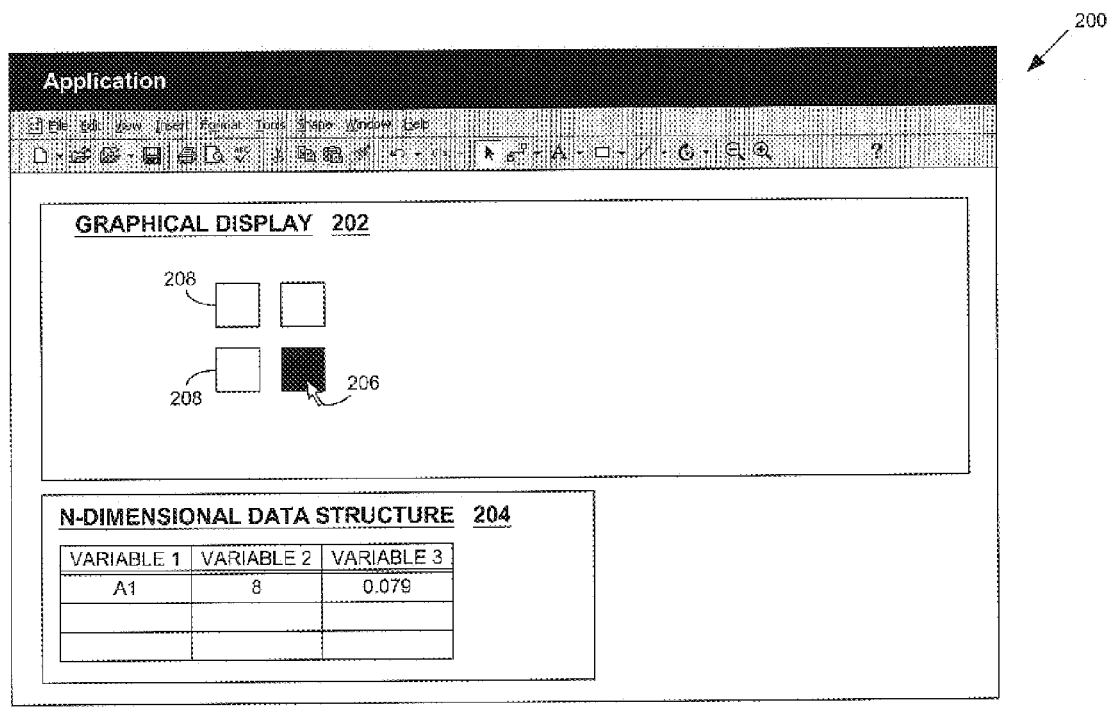
FIG. 4 illustrates the screen shot of FIG. 2 in which the data structure has been populated in response to the selection of an image object in the graphical display portion.

With reference to the screen shots of FIGS. 4 and 5 of a representative graphical user interface, a particular embodiment of graphical display/data structure linking system 110 will be described. FIG. 4 illustrates the screen shot of FIG. 2 during operation of graphical display/data structure linking system 110. As stated above, graphical display/data structure linking system 110 enables a user to select one or more of the image objects 208 in the graphical display 202 via cursor 206. After an image object 208 is selected, graphical display/data structure linking system 110 may visually distinguish the selected image object to indicate that it has been selected. For instance, in the embodiment illustrated in FIG. 4, graphical display/data structure linking system 110 may highlight or change the color of the selected image object 208.

Furthermore, graphical display/data structure linking system 110 may automatically populate the data structure with data corresponding to the selected image object 208. For example, as illustrated in FIG. 4, the selected image object 20 may have three types of data associated with it, each type corresponding to variable 1, variable 2, and variable 3. The selected image object 208 may have the following data associated with each of the variables: variable 1=A1; variable 2=8; and variable 3=0.079. In this manner, when the image object is selected, graphical display/data structure linking system 110 may automatically populate the corresponding data structure with the appropriate values.

Figure 5:
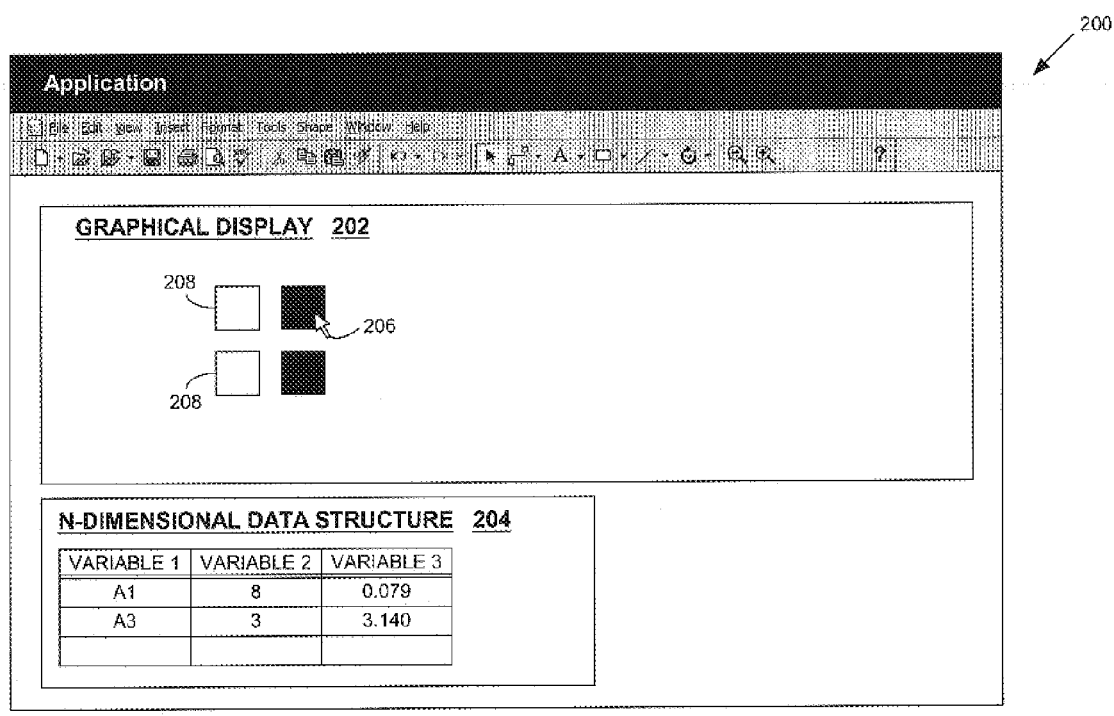
FIG. 5 illustrates the screen shot of FIG. 2 in which the data structure has been populated in response to the selection of another image object in the graphical display portion.

FIG. 5 illustrates the screen shot of FIG. 4 in which the data structure has been populated in response to the selection of another image object 208. As illustrated in FIG. 5, the second image object 208 selected has the following data associated with each of the variables: variable 1=A3; variable 2=3; and variable 3=3.140. One of ordinary skill in the art will appreciate that the data associated with image objects 208 that is used to populate the data structure may comprise any data. By way of example, an image object 208 may be identified with a specific location (e.g., an x location and a y location on a grid) within the graphical display and/or a corresponding location in an external system. The image object 208 may also be associated with other image objects 208. Some of the data used to populate the data structure may identify the association between image objects 208. Furthermore, the image object may have various attributes. Thus, when an image object is selected, any of the data associated with the image object, or other data, may be used to populate the corresponding data structure.

Figure 6:
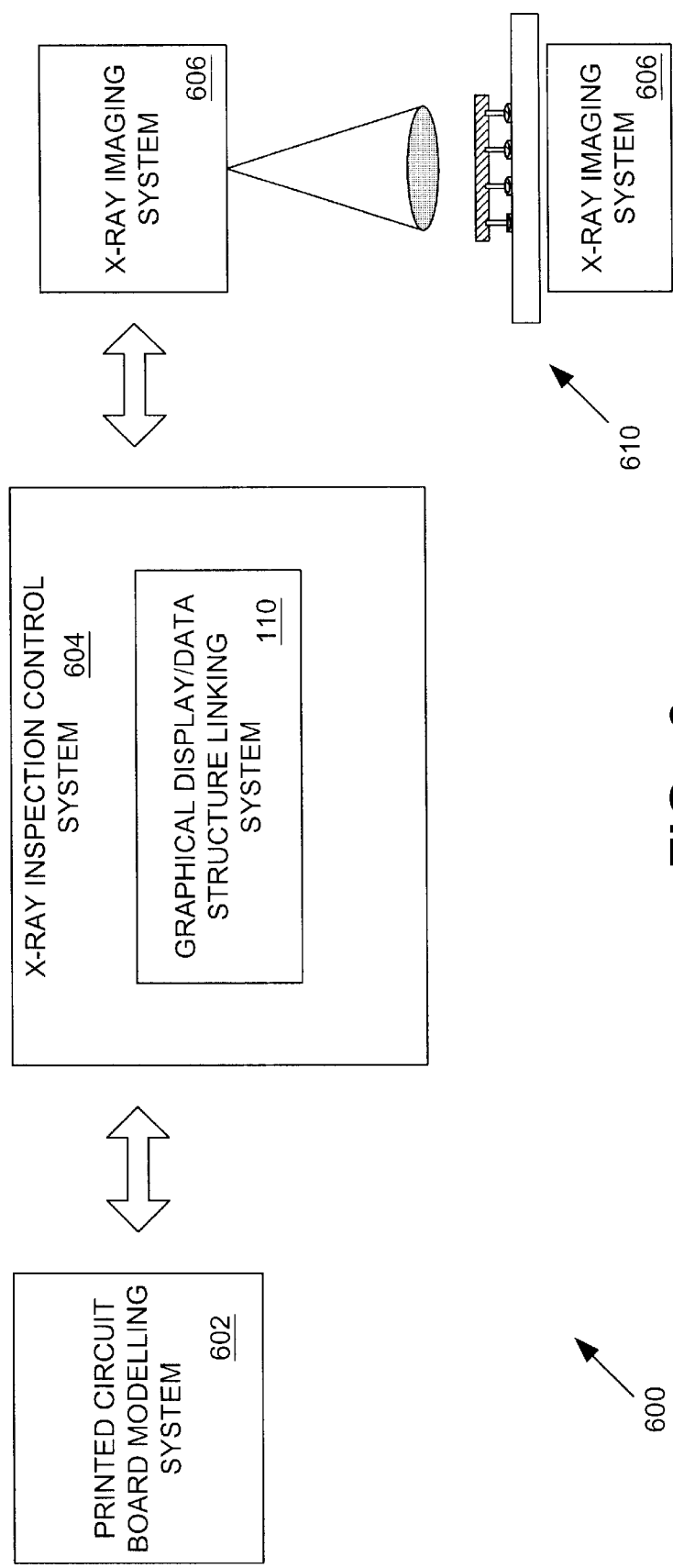
FIG. 6 is a block diagram of another embodiment of a system in which the graphical display/data structure linking system of the present invention may be implemented.

Graphical display/data structure linking system 110 may be implemented in a variety of other systems and/or a variety of computer applications. FIG. 6 is a block diagram of a system 600 for inspecting manufacturing defects in printed circuit boards, in which graphical display/data structure linking system 110 may be implemented. System 600 comprises a printed circuit board modeling system 602, an x-ray inspection control system 604, an x-ray imaging system 606, and a printed circuit board 610. In general, PCB modeling system 602 is a system for generating a computer model of a printed circuit board. PCB modeling system 602 may be any known or later developed computer-aided design (CAD) system capable of modeling any type of printed circuit board.

Figure 7:
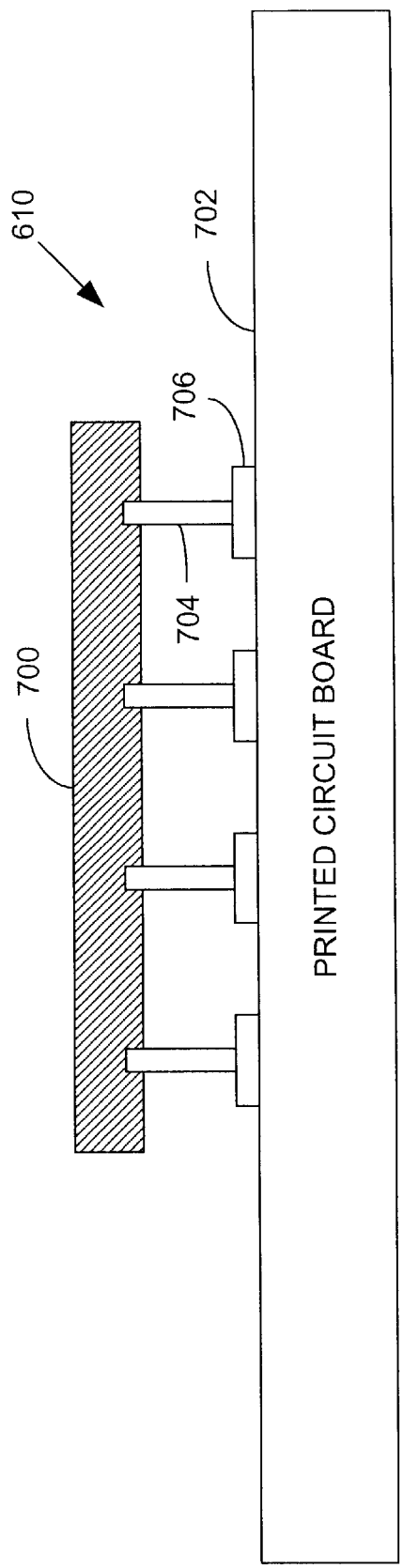
FIG. 7 is a block diagram illustrating a printed circuit board that may be inspected by the system of FIG. 6.
Figure 8:
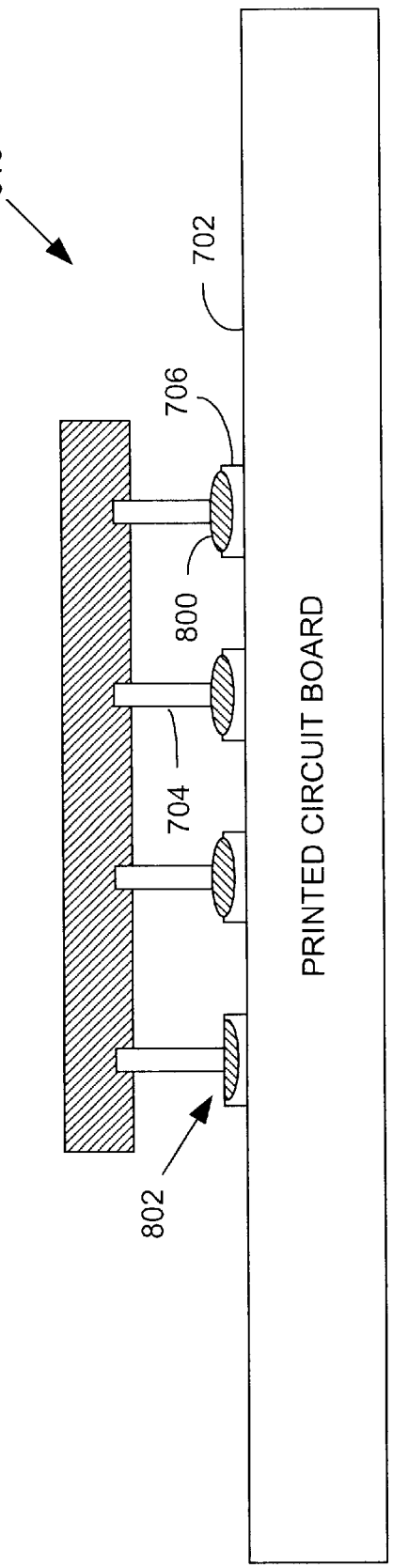
FIG. 8 is a block diagram illustrating a printed circuit board that may be inspected by the system of FIG. 6, which has a manufacturing defect.

FIGS. 7 and 8 illustrate cross-sectional diagrams of a printed circuit board 610 that may be modeled using PCB modeling system 602 and inspected using system 600. As illustrated in FIG. 7, printed circuit board 610 may comprise a component 700 having one or more pins 704. Component 700 may comprise any type of electrical component for which it is desirable to solder to a PCB substrate 702. PCB substrate 702 includes an underlying integrated circuit (IC) that comprises a plurality of termination points 706, which may be soldered to the pins 704 during the manufacturing process.

As illustrated in FIG. 8, during the manufacturing process, component 700 may be electrically connected to the termination points 706 on the PCB substrate 702 via a soldering material 800. FIG. 8 illustrates printed circuit board 610 after the soldering process. By way of example, during the manufacturing process a variety of defects may result. For instance, in FIG. 8, the left-most pin 704 may have a soldering defect (represented by reference numeral 802). One of ordinary skill in the art will appreciate that any of the following, or other, defects may occur during the manufacturing process: open solder joints, shorts, missing components, misaligned components, insufficient solder joints, excess solder joints, reversed capacitors, solder balls, solder voids, etc.

X-ray imaging system 606 comprises imaging hardware and/or software for capturing an x-ray image of a manufactured printed circuit board. One of ordinary skill in the art will appreciate that system 600 may employ any of a variety of other types of imaging techniques (e.g., optical, ultrasonic, thermal image, etc.). X-ray inspection control system 604 interfaces with PCB modeling system 602 and x-ray imaging system 606. For instance, x-ray inspection control system 604 may receive a file containing a computer model of a particular printed circuit board from PCB modeling system 602. Based on the computer model, x-ray inspection control system 604 may generate an inspection program to be implemented by x-ray imaging system 606. The inspection program may be used to image a manufactured printed circuit board, which is based on the computer model generated by PCB modeling system 602. After generating images of the manufactured printed circuit board, the images may be compared to the computer model to inspect for a variety of manufacturing defects (e.g., open solder joints, shorts, missing components, misaligned components, insufficient solder joints, excess solder joints, reversed capacitors, solder balls, solder voids, etc).

As illustrated in FIG. 6, x-ray inspection control system 604 may implement graphical display/data structure linking system 110 in order to improve the inspection process and facilitate generation of the inspection program provided to x-ray imaging system 606. As described above generally, graphical display/data structure linking system 110 supports a graphical user interface configured for interaction with a user, in which a graphical display may be linked to an n-dimensional data structure. In the embodiment illustrated in FIG. 6, graphical display/data structure linking system 110 may be configured to display a model of a printed circuit board in the graphical display portion. For instance, in the graphical display of a model of a printed circuit board, the one or more image objects may comprise a particular component on the printed circuit board, a pin on a particular component, a solder joint, etc. In order to generate the inspection program used to image a manufactured printed circuit board, which is based on the displayed computer model, graphical display/data structure linking system 110 enables a user to select one or more of the image objects of the printed circuit board. Based on the selection of a particular image object (e.g., one of the pins), graphical display/data structure linking system 110 may automatically populate the n-dimensional data structure with data corresponding to the selected image object.

Figure 9:
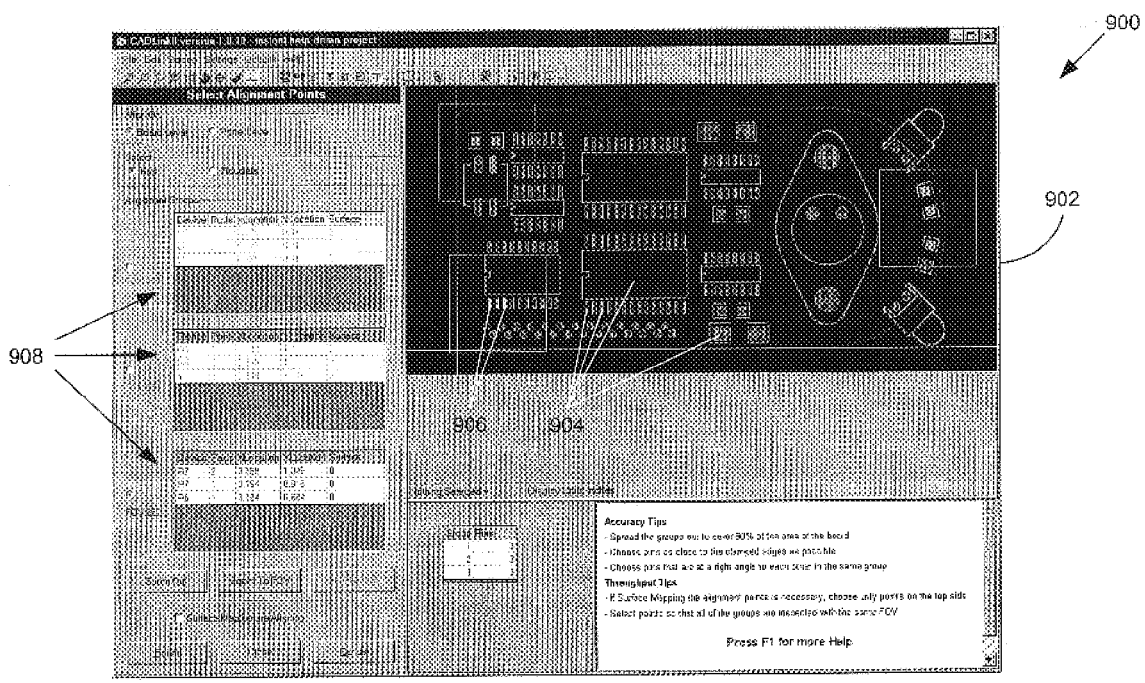
FIG. 9 is a screen shot of another embodiment of a graphical user interface generated by the graphical display/data structure linking system of FIGS. 1 and 3, which may be implemented in the x-ray inspection control system of FIG. 8.

FIG. 9 is a screen shot 900 of another embodiment of a graphical user interface generated by graphical display/data structure linking system 110 and which may be implemented in x-ray inspection control system 604. The graphical user interface may comprise a portion 902 for displaying the printed circuit board model. As illustrated in FIG. 9, the printed circuit board model may comprise image objects 904 (e.g., a particular component on the printed circuit board, a pin on a particular component, a solder joint, etc.). Image objects 904 that have been selected are represented by numeral 906. As described above, the graphical user interface may comprise one or more data structures 908. Where multiple data structures 908 are included, graphical display/data structure linking system may visually distinguish selected image objects 906 by color coding them to the corresponding data structure 908 that it populates.

In the embodiment illustrated in FIG. 9, the data structures 908 comprise data tables corresponding to various Alignment Groups associated with x-ray imaging system 606. Furthermore, each data structure 908 may include the following variables: a "device" variable; a "Pads" variable; an "Xlocation" variable; a "Ylocation" variable; and a "Surface" variable. Data structures 908 and the image objects 904 may be linked as described above.

It should be emphasized that the above-described embodiments of graphical display/data structure linking system 110, particularly, any "described" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and protected by the following claims.

What is claimed is:

1. A method for controlling the inspection of a printed circuit board for manufacturing defects, the method comprising the steps of:
   receiving a computer model of a printed circuit board to be inspected for manufacturing defects;
   providing a graphical display of the computer model of the printed circuit board in a first portion of a graphical user interface;
   providing an n-dimensional data structure associated with the graphical display of the computer model of the printed circuit board in a second portion of the graphical user interface;
   enabling a user to select one of a plurality of image objects in the graphical display of the computer model of the printed circuit board; and
   populating the n-dimensional data structure with information corresponding to the selected image object to assist the user in controlling an imaging system being used to inspect a manufactured printed circuit board corresponding to the computer model of the printed circuit board for manufacturing defects.

2. The method of claim 1, wherein the information corresponding to the selected image object includes alignment point data to assist the user in controlling the imaging system.

3. The method of claim 1, wherein the information corresponding to the selected image object assists the user in generating an inspection program to be implemented by the imaging system to inspect the manufactured printed circuit board.

4. The method of claim 3, further comprising the step of generating the inspection program to be implemented by the imaging system.

5. The method of claim 1, wherein the image objects correspond to one or more components having one or more pins soldered to the printed circuit board.

6. The method of claim 1, wherein the information corresponding to the selected image object includes the location of the image object selected.

7. The method of claim 1, wherein at least one of the image objects comprises a pin soldered to the printed circuit board.

8. The method of claim 7, wherein the information corresponding to the selected image object includes a component associated with the pin.

9. The method of claim 7, wherein the information corresponding to the selected image object includes a pin number associated with the pin.

10. A system for inspecting manufacturing defects in a printed circuit board, the system comprising:
    an imaging system for capturing an image of a manufactured printed circuit board; and
    an inspection control system in communication with the imaging system and configured to control the manner in which the imaging system images the manufactured printed circuit, the inspection control system comprising a computer program for assisting a user to generate an inspection program to be implemented by the imaging system, the computer program comprising:
    logic configured to receive a computer model of the manufactured printed circuit board to be inspected for manufacturing defects;

logic configured to provide a graphical display of the computer model of the manufactured printed circuit board in a first portion of a graphical user interface;

logic configured to provide an n-dimensional data structure associated with the graphical display of the computer model of the manufactured printed circuit board in a second portion of the graphical user interface;

logic configured to enable a user to select one of a plurality of image objects in the graphical display of the computer model of the manufactured printed circuit board; and logic configured to populated the n-dimensional data structure with information corresponding to the selected image object to assist the user in generating the inspection program.

11. The system of claim 10, further comprising a printed circuit board modeling system for generating the computer model of the printed circuit board.

12. The system of claim 10, wherein the imaging system employs x-ray imaging.

13. The system of claim 10, wherein the information corresponding to the selected image object includes alignment point data to assist the user in controlling the imaging system.

14. The system of claim 10, wherein the image objects correspond to one or more components having one or more pins soldered to the printed circuit board.

15. The system of claim 10, wherein the information corresponding to the selected image object includes the location of the image object selected.

16. The system of claim 10, wherein at least one of the image objects comprises a pin soldered to the printed circuit board.

17. The system of claim 16, wherein the information corresponding to the selected image object includes a component associated with the pin.

18. The system of claim 16, wherein the information corresponding to the selected image object includes a pin number associated with the pin.

19. A computer program embodied in a computer-readable medium for controlling the inspection of a printed circuit board for manufacturing defects, the computer program comprising:

logic configured to receive a computer model of a printed circuit board to be inspected for manufacturing defects;

logic configured to provide a graphical display of the computer model of the printed circuit board in a first portion of a graphical user interface;

logic configured to provide an n-dimensional data structure associated with the graphical display of the computer model of the printed circuit board in a second portion of the graphical user interface;

logic configured to enable a user to select one of a plurality of image objects in the graphical display of the computer model of the printed circuit board; and logic configured to populate the n-dimensional data structure with information corresponding to the selected image object to assist the user in controlling an imaging system being used to inspect a manufactured printed circuit board corresponding to the computer model of the printed circuit board for manufacturing defects.

20. The computer program of claim 19, wherein the information corresponding to the selected image object includes alignment point data to assist the user in controlling the imaging system.

21. The computer program of claim 19, wherein the information corresponding to the selected image object assists the user in generating an inspection program to be implemented by the imaging system to inspect the manufactured printed circuit board.

22. The computer program of claim 19, wherein the image objects correspond to one or more components having one or more pins soldered to the printed circuit board.

23. The computer program of claim 19, wherein the information corresponding to the selected image objects includes the location of the image object selected.

24. The computer program of claim 19, wherein at least one of the image objects comprises a pin soldered to the printed circuit board.

25. The computer program of claim 24, wherein the information corresponding to the selected image object includes a component associated with the pin.

26. The computer program of claim 24, wherein the information corresponding to the selected image object includes a pin number associated with the pin.

* * * * *